United States Patent
Marripudi et al.

(10) Patent No.: US 10,423,487 B2
(45) Date of Patent: Sep. 24, 2019

(54) DATA PROTECTION OFFLOADS USING SSD PEERING

(71) Applicant: Samsung Electronics Co., Ltd., Suwon-si, Gyeonggi-do (KR)

(72) Inventors: Gunneswara R. Marripudi, Fremont, CA (US); Stephen G. Fischer, Mountain View, CA (US); John Ping, Milpitas, CA (US); Indria Joshi, Saratoga, CA (US); Harry R. Rogers, San Jose, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 383 days.

(21) Appl. No.: 15/351,434

(22) Filed: Nov. 14, 2016

(65) Prior Publication Data

US 2018/0052624 A1    Feb. 22, 2018

Related U.S. Application Data

(63) Continuation-in-part of application No. 15/297,130, filed on Oct. 18, 2016, now abandoned.
(Continued)

(51) Int. Cl.
*G06F 11/00* (2006.01)
*G06F 11/10* (2006.01)
(Continued)

(52) U.S. Cl.
CPC ........ *G06F 11/1072* (2013.01); *G06F 11/108* (2013.01); *G06F 11/1012* (2013.01); *G06F 13/4282* (2013.01); *G11C 29/52* (2013.01)

(58) Field of Classification Search
CPC ............. G06F 11/1012; G06F 11/1072; G06F 11/108; G06F 13/4282
See application file for complete search history.

(56) References Cited

U.S. PATENT DOCUMENTS 5,680,579 A * 10/1997 Young .................. G06F 3/0601
                                                     711/100
6,219,753 B1    4/2001 Richardson
(Continued)

OTHER PUBLICATIONS

Yimo, Du et al., "WeLe-RAID: A SSD-based RAID for System Endurance and Performance." IFIP International Conference on Network and Parallel Computing, Springer Berlin Heidelberg, 2011, found via Google Scholar (url: https://pdfs.semanticscholar.org/56e2/223ef6feed712a0765dd451f363fe7554a95.pdf), 15 pages.

*Primary Examiner* — Joshua P Lottich

(74) *Attorney, Agent, or Firm* — Renaissance IP Law Group LLP

(57) ABSTRACT

A storage system includes a plurality of solid-state drives (SSDs) in which each SSD is an endpoint of a peer group in which one SSD is a primary SSD of the peer group, or all SSDs are treated as equal peers. Each SSD further includes a host interface port coupled to a host computing device that receives receive input/output (I/O) communications from the host computing device, a peer-interface port coupled to the peer-interface port of each other SSD in the peer group; and a controller coupled to the host interface port and the peer-interface port. The primary SSD controller is responsive to I/O communications received from the host computing device to provide data-protection computations relating to a coordinated data-protection configuration provided by the peer group and to pass the coordinated data-protection configuration information to the controllers of the other end points of the peer group through the peer-interface port.

28 Claims, 14 Drawing Sheets

Related U.S. Application Data

(60) Provisional application No. 62/377,528, filed on Aug. 19, 2016.

(51) Int. Cl.
    *G06F 13/42* (2006.01)
    *G11C 29/52* (2006.01)

(56) References Cited

U.S. PATENT DOCUMENTS

| | | | |
|---|---|---|---|
| 6,996,672 B2 | 2/2006 | Lubbers et al. | |
| 8,554,997 B1* | 10/2013 | Bonwick | G06F 3/0689 |
| | | | 711/114 |
| 8,819,092 B2 | 8/2014 | Ludwig et al. | |
| 9,286,261 B1* | 3/2016 | Tzelnic | G06F 16/1847 |
| 9,891,826 B1* | 2/2018 | Um | G06F 3/0604 |
| 2008/0040553 A1* | 2/2008 | Ash | G06F 11/1076 |
| | | | 711/133 |
| 2008/0148025 A1* | 6/2008 | Gopal | G06F 11/1076 |
| | | | 712/225 |
| 2010/0017649 A1* | 1/2010 | Wu | G06F 11/108 |
| | | | 714/6.11 |
| 2014/0189212 A1* | 7/2014 | Slaight | G06F 12/0866 |
| | | | 711/103 |
| 2015/0169221 A1* | 6/2015 | Shirasu | G06F 3/0685 |
| | | | 711/163 |

* cited by examiner

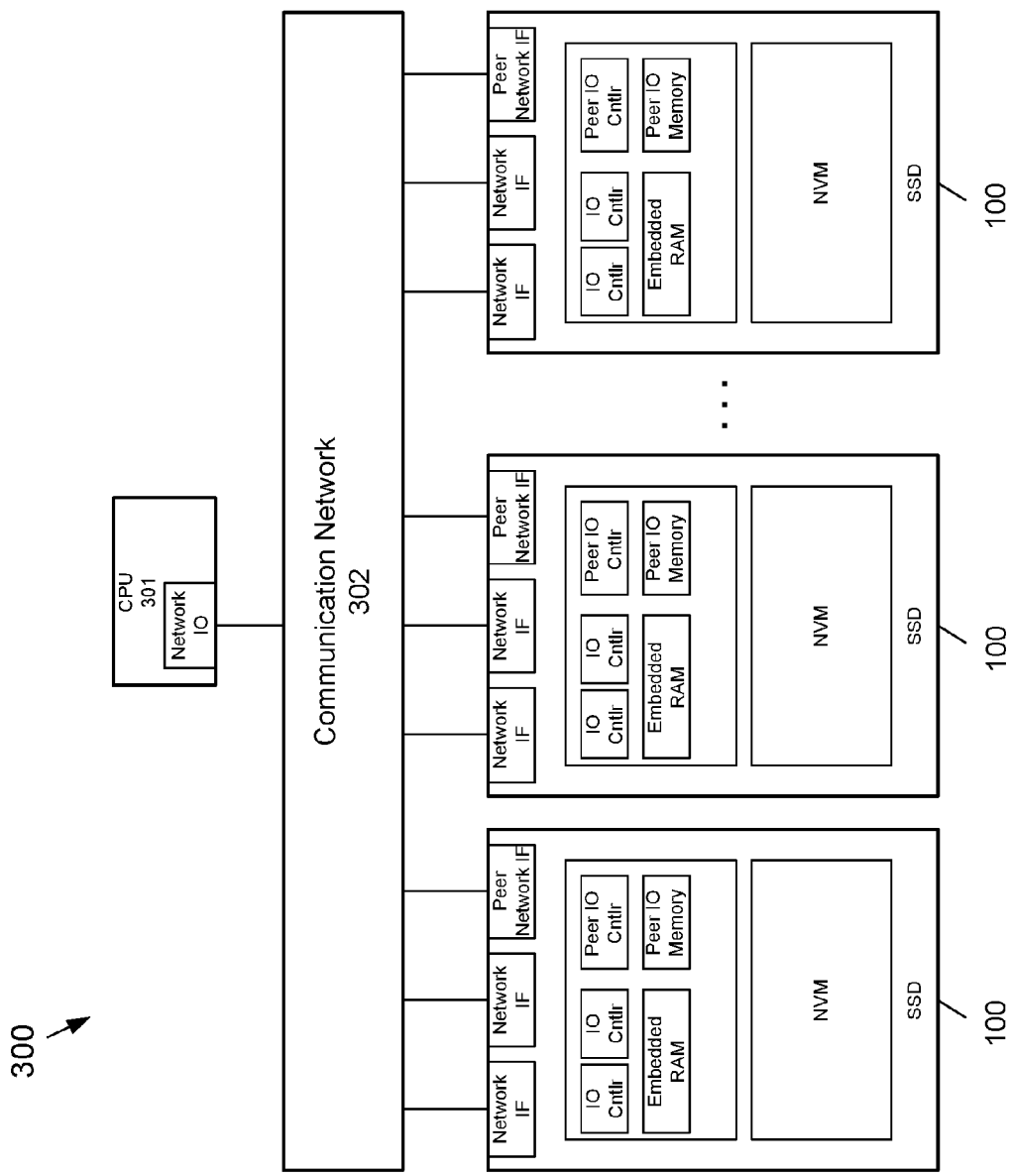

DATA PROTECTION OFFLOADS USING SSD PEERING

CROSS-REFERENCE TO RELATED APPLICATION

This patent application is a continuation-in-part of U.S. patent application Ser. No. 15/297,130, filed on Oct. 18, 2016, which claims the priority benefit under 35 U.S.C. § 119(e) of U.S. Provisional Patent Application No. 62/377,528, filed on Aug. 19, 2016, the disclosure of which is incorporated herein by reference in its entirety.

BACKGROUND

Data protection is a critical feature for storage systems. Popular techniques that are used to provide data protection for storage systems include Redundant Array of Independent Disks (RAID), Erasure Coding, Replication, etc. Replication, for example, may be embodied as a RAID-1 configuration (mirroring). Erasure coding may be expressed as a solution across multiple nodes rather than a single node.

There are two alternative approaches used today to provide RAID configurations—a software approach (SW RAID) and a hardware approach (HW RAID). SW RAIDs typically are embodied as a software module that runs on the same host where the storage system drives are physically present. HW RAIDs are often embodied as a controller Application Specific Integrated Circuit (ASIC), such as a RAID on Chip (ROC), that provides host connectivity to the drives of the storage system and that offloads the RAID computations from a host central processing unit (CPU).

Advantages of a SW RAID approach include a relatively low acquisition cost, because the SW RAID is usually integrated into the operation system (OS) of a host system, and ease to upgrade and/or change the RAID mechanism. Although the acquisition cost for a SW RAID may be relatively low, the acquisition cost may be lower per unit for an HW raid approach for a given performance point. Disadvantages of a SW RAID include that the SW RAID is operational after the host system boots (initializes). Any drive failures during boot could lead to a SW RAID not initiating, but such a disadvantage might be alleviated by implementing a RAID BIOS. Another disadvantage is that a SW RAID shares compute resources of the host system and, therefore, system performance may be adversely impacted. This disadvantage may be reduced by utilizing a relatively simple SW RAID algorithm. Still another disadvantage includes that a write-back cache cannot use battery backup and must be a write-through system. Yet another disadvantage of a SW RAID is that CPUs having a higher core count or having XOR instruction support could potentially increase the acquisition cost associated with such SW RAID systems.

Advantages of a HW RAID approach include offloading the dedicated computation and memory access RAID functionality from a host system CPU. Additionally, HW RAIDs include an ability to provide more complex RAID configurations, such as RAID 5 and RAID 6, thereby providing a relatively high performance-to-cost ratio. HW RAIDs are also protected at boot, and upgrade and/or migration to a different OS is relatively easy because HW RAIDs are OS agnostic. Disadvantages of the HW RAIDs include a performance that is limited by the performance of the ROC hardware, and HW RAIDs have a relatively high cost because an I/O processor and additional memory on, for example, a plug-in-type card, increases costs.

SUMMARY

An example embodiment provides a storage system that may include a plurality of solid-state drives (SSDs) in which each SSD may include an end point of a peer group of SSDs and in which one SSD may be a primary SSD of the peer group, each SSD may further include a host interface port that is to be communicatively coupled to at least one host computing device in which the host interface port is to receive input/output (I/O) communications from the at least one host computing device; a peer-interface port that is to be communicatively coupled to the peer-interface port of each other SSD in the peer group; and a controller coupled to the interface port and the peer-interface port in which the controller of the primary SSD of the peer group is to be responsive to I/O communications received from the at least one host computing device to provide data-protection computations relating to a coordinated data-protection configuration provided by the peer group and to pass the coordinated data-protection configuration information to the controllers of the other end points of the peer group through the peer-interface port. In one embodiment, the host interface ports and the peer-interface ports of the SSDs of the peer group are to be coupled to the at least one host computing device through a Peripheral Component Interface Express (PCIe) communication network, an Ethernet communication network, an InfiniBand communication network, a Fibre Channel communication network, or a Serial Attached SCSI communication network.

An example embodiment provides an SSD that may include a host interface port that is capable of being communicatively coupled to at least one host computing device in which the host interface port is to receive input/output (I/O) communications from the at least one host computing device; a peer-interface port that is capable of being communicatively coupled to a peer-interface port of other SSDs of a peer group of SSDs; and a controller coupled to the host interface port and the peer-interface port in which the controller is to be responsive to I/O communications received from the at least one host computing device to provide data-protection computations relating to a coordinated data-protection configuration provided by the peer group of SSDs and to pass coordinated data-protection configuration information to the controllers of the other SSDs of the peer group through the peer-interface port. In one embodiment, the host interface port and the peer-interface port of the SSD are to be capable of being coupled to the at least one host computing system through a Peripheral Component Interface Express (PCIe) communication network, an Ethernet communication network, an InfiniBand communication network, a Fibre Channel communication network, or a Serial Attached SCSI communication network.

An example embodiment provides a storage system that may include a plurality of SSDs in which each SSD may include a peer endpoint in a peer group of SSDs, each SSD may further include a host interface port that is to be communicatively coupled to at least one host computing device in which the host interface port is to receive input/output (I/O) communications from the at least one host computing device; a peer-interface port that is to be communicatively coupled to the peer-interface port of other SSDs in the peer group; and a controller coupled to the host interface port and the peer-interface port in which the controller is to be responsive to I/O communications received from the at least one host computing device to provide data-protection computations relating to a coordinated data-protection configuration provided by the peer group and to pass coordinated data-protection configuration information to the other peer end points of the peer group through the peer-interface port. In one embodiment, the host interface port and the peer-interface port of the SSD are to be communicatively coupled to the at least one host computing device through a Peripheral Component Interface Express (PCIe) communication network, an Ethernet communication network, an InfiniBand communication network, a Fibre Channel communication network, or a Serial Attached SCSI communication network.

BRIEF DESCRIPTION OF THE DRAWINGS

In the following section, the aspects of the subject matter disclosed herein will be described with reference to embodiments illustrated in the figures, in which:

FIG. 3A depicts an embodiment of a plurality of network-attached SSDs, each having peering capability according to the subject matter disclosed herein, arranged in a network that connects to a single host CPU;

DETAILED DESCRIPTION

Figure 1A:
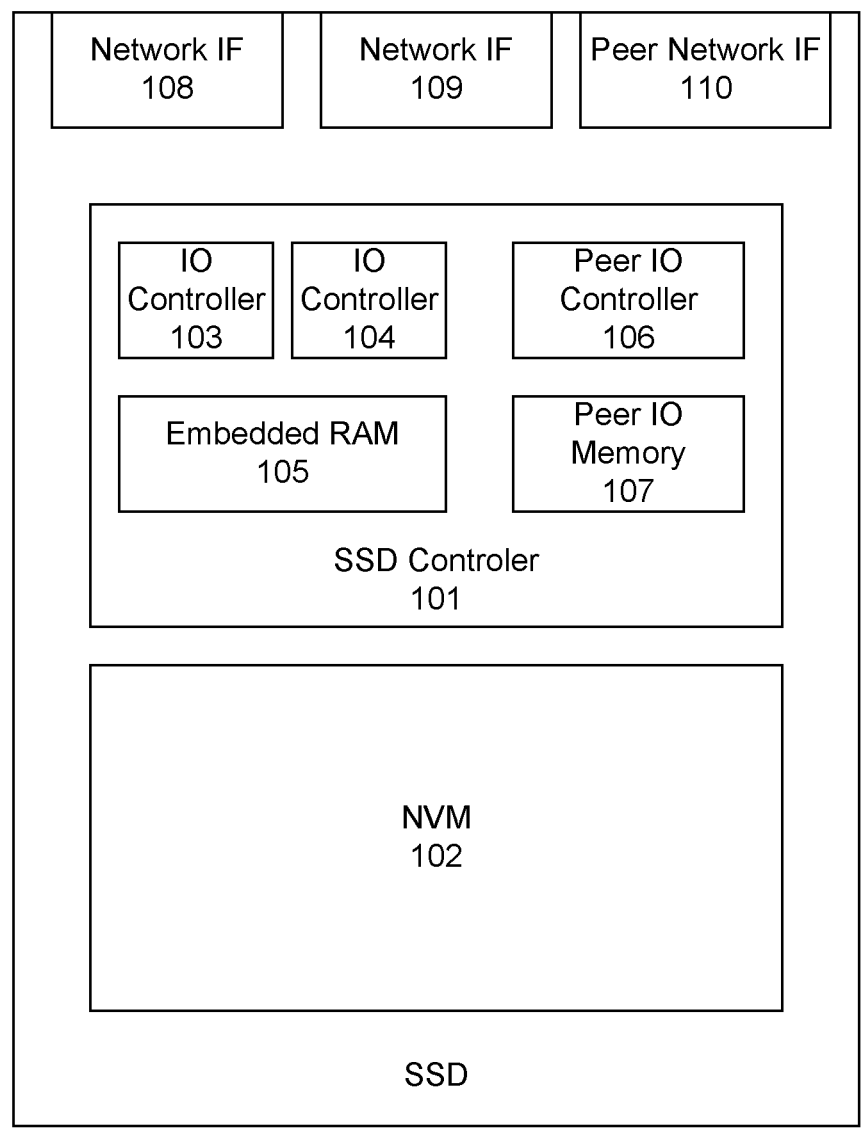
FIG. 1A depicts an example embodiment of an SSD capable of being attached to a network and having peering capabilities according to the subject matter disclosed herein.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail not to obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not be necessarily all referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. Similarly, various waveforms and timing diagrams are shown for illustrative purpose only. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing particular exemplary embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement the teachings of particular embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "module" refers to any combination of software, firmware and/or hardware configured to provide the functionality described herein in connection with a module. The software may be embodied as a software package, code and/or instruction set or instructions, and the term "hardware," as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, but not limited to, an integrated circuit (IC), system on-chip (SoC) and so forth.

The subject matter disclosed herein provides features and capabilities that may be embedded in a solid-state drive (SSD) to form a peer group of SSD endpoints in which each SSD endpoint in the peer group includes the embedded features and capabilities. The features and capabilities, in turn, provide functionality to protect data loss against drive failures, load balance IO to the SSD devices, offload intensive data-protection-related computations from a host CPU to SSDs without any performance tradeoffs, and offload physical IO from the CPU. Accordingly, no intermediary device is needed between a host CPU and an SSD having peering capabilities as disclosed herein, thereby providing a highest performance possible for a host CPU because CPU overhead is minimized. Further, one embodiment may utilize an Asynchronous (Async) Event notification message to alert a host system about peer group changes and/or detected faults.

The subject matter disclosed herein coordinates IO processing across a peer group of SSD devices. Moreover, the subject matter disclosed herein allows the SSDs of a peer group to utilize an interface that is based on, but not limited to, a PCIe communication network interface, an Ethernet communication network interface, an InfiniBand communication network, a Fibre Channel (FC) communication network, or a Serial Attached SCSI (SAS) communication network.

FIG. 1A depicts an example embodiment of an SSD capable of being attached to a network and having peering capabilities according to the subject matter disclosed herein. As shown in FIG. 1A, the SSD 100 includes an SSD controller 101 and nonvolatile memory (NVM) 102. The SSD controller 101 includes a first IO controller 103, a second IO controller 104, embedded random access memory (RAM) 105, a peer IO controller 106 and a peer IO memory 107. The SSD 100 also includes a first network interface (IF) 108, a second network IF port 109 and a peer network IF port 110. The first IO controller 103 and the second IO controller 104 are respectively communicatively coupled to the first network interface 108 and the second network interface 109. The first IO controller 103 and the second IO controller 104 provide root port functionality for host software to communicate commands and data to the SSD 100. The first network IF 108 and the second network IF 109 may communicatively couple the SSD 100 to one or more host devices (not shown in FIG. 1A) over, for example, a communication network (not shown in FIG. 1A). In one embodiment, the embedded RAM 105 may include power-failure protection.

The peer network IF port 110 may be communicatively coupled to a communication network (not shown in FIG. 1A), such as, but not limited to, an Ethernet communication network, an InfiniBand communication network, a Fibre Channel communication network, or a Serial Attached SCSI communication network, to communicate with other peer SSDs (endpoints) in a peer group. The peer IO controller 106 is communicatively coupled to the peer network IF 110 to provide IO functionality. In one embodiment, the peer IO controller 106 may be combined into the first IO controller 103 or the second IO controller 104. In some embodiments, the network IF and the peer network IF may be combined, particularly in an Ethernet or an InfinitBand environment. In an erasure-coded peer group, only a separate logical connection may be used. In one embodiment, the peer IO memory 107 may include power-failure protection.

Figure 1B:
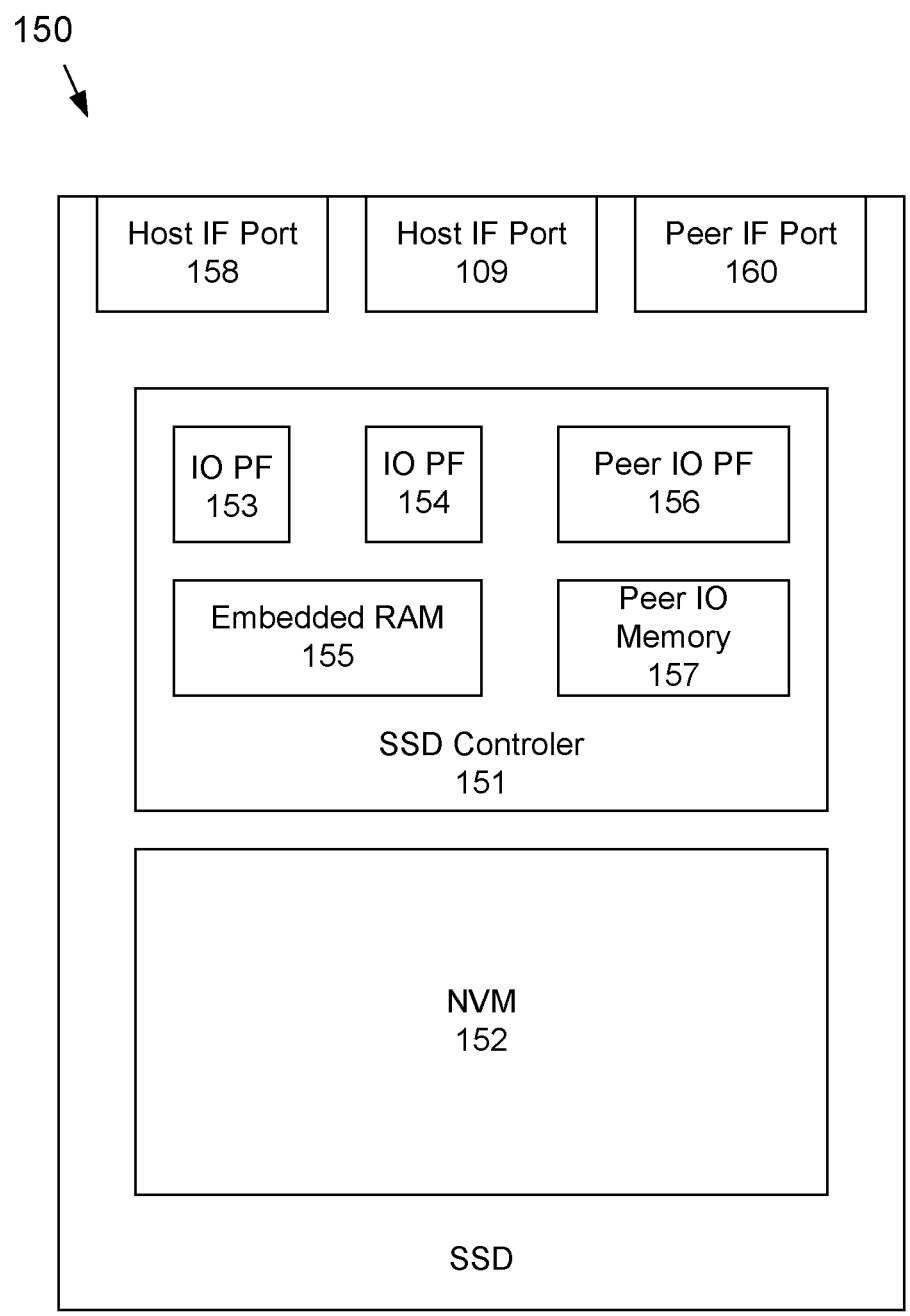
FIG. 1B depicts an example embodiment of an SSD capable of being attached to a PCIe fabric and having peering capabilities according to the subject matter disclosed herein.

FIG. 1B depicts an example embodiment of an SSD 150 capable of being attached to a PCIe fabric and having peering capabilities according to the subject matter disclosed herein. As shown in FIG. 1B, the SSD 150 includes an SSD controller 151 and NVM 152. The SSD controller 151 includes a first IO physical function (PF) 153, a second IO PF 154, embedded RAM 155, a peer IO PF 156 and a peer IO memory 157. The SSD 150 also includes a first host interface (IF) port 158, a second host IF port 159 and a peer IF port 160. The first IO PF 153 and the second IO PF 154 are respectively communicatively coupled to the first host IF port 158 and the second host IF port 159. The first IO PF 153 and the second IO PF 154 provide root port functionality for host software to communicate commands and data to the SSD 150. The first host IF port 158 and the second host IF port 159 may communicatively couple the SSD 150 to one or more host devices (not shown in FIG. 1B) over, for example, a PCIe fabric (not shown in FIG. 1B). In one embodiment, the embedded RAM 155 may include power-failure protection.

The peer IF port 160 is communicatively coupled to the PCIe fabric (not shown in FIG. 1B) to communicate with other peer SSDs (endpoints) in a peer group. The peer IO PF 156 is communicatively coupled to the peer IF port 160 to provide IO functionality. In one embodiment, the peer IO PF 156 may be combined into the first IO PF 153 or the second IO PF 154. In some embodiments, the host IF port and the peer IF port may be combined. In an erasure-coded peer group, only a separate logical connection may be used. In one embodiment, the peer IO memory 157 may include power-failure protection.

It should be understood that a PCIe SSD 150 may include more than two hosts IF ports and/or may include only one host IO PF. Also, as used herein, the term "physical function (PF)" and the term "virtual function (VF), may be used interchangeably. That is, the physical functions described in connection with the subject matter disclosed herein may be interchangeable with virtual functions. Thus, physical functions described herein may alternatively be embodied as virtual functions.

Figure 2A:
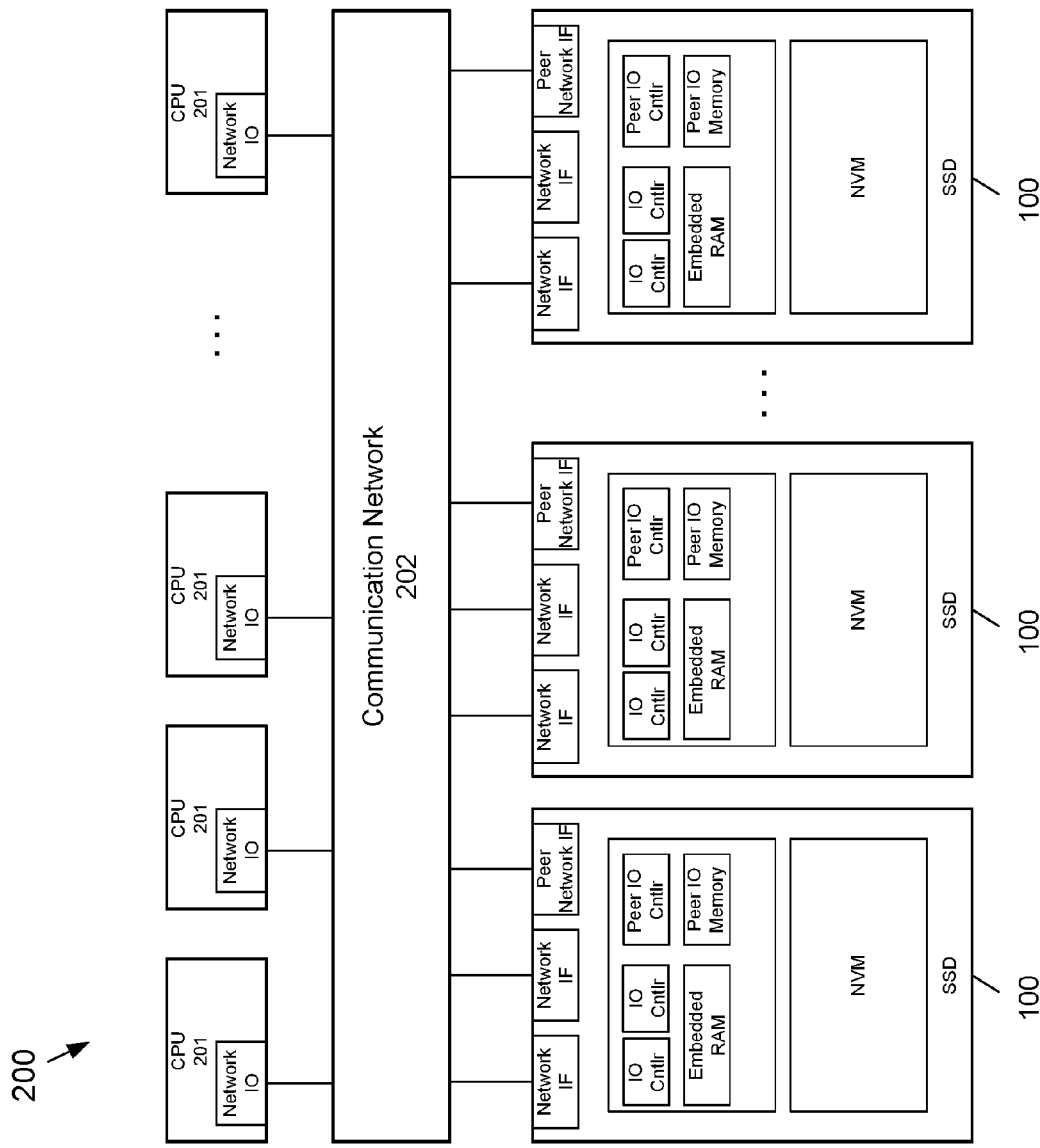
FIG. 2A depicts an embodiment of a plurality of network-attached SSDs, each having peering capability according to the subject matter disclosed herein, arranged in a network that connects to multiple hosts.

FIG. 2A depicts an embodiment of a plurality of network-attached SSDs 100, each having peering capability according to the subject matter disclosed herein, arranged in a network 202 that connects to multiple hosts 201. As depicted in FIG. 2A, the network 200 includes a plurality of host CPUs 201 and a plurality of network-attached SSDs 100 that are communicatively coupled to a communication network 202, such as, but not limited to, an Ethernet communication network, an InfiniBand communication network, a Fibre Channel communication network, or a Serial Attached SCSI communication network. It should be understood that there may be other resources and/or components that are communicatively coupled to the communication network 202 that are not depicted in FIG. 2A.

Each of the host CPUs 201 is communicatively coupled to the communication network 202 through a network IF. Each of the network-attached SSDs 100 is also coupled to the communication network 202 through one or more network IFs. Each SSD 100 of a peer group includes a peer network IF that communicatively couples the SSD 100 to other SSD 100 endpoints through a link within the communication network 202. Although not explicitly depicted in FIG. 2A, peer communications between the SSDs 100 of a peer group may be separate from other communications through the network 202, such as but not limited to between CPUs 201, between CPUs 201 and network-attached SSDs 100, and/or between CPUs 201 and any other resources and/or components (not shown).

Figure 2B:
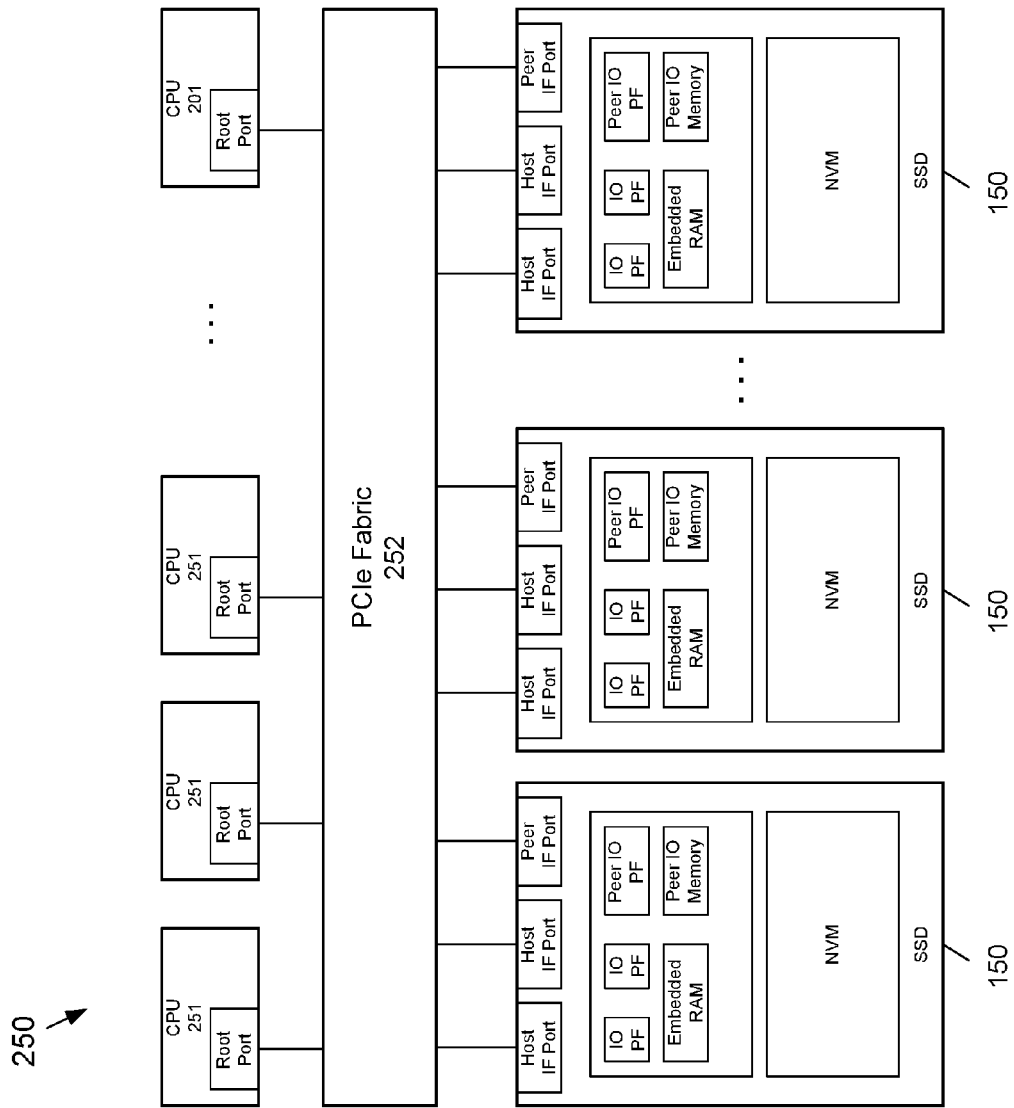
FIG. 2B depicts an embodiment of a plurality of SSDs, each having a peering capability according to the subject matter disclosed herein, attached to a PCIe fabric that includes multiple host CPUs.

FIG. 2B depicts an embodiment of a plurality of SSDs 150, each having a peering capability according to the subject matter disclosed herein, attached to a PCIe fabric that includes multiple host central processing units (CPUs). As depicted in FIG. 2B, the network 250 includes a plurality of host CPUs 251 and a plurality of PCIe SSDs 150 that are communicatively coupled to a PCIe fabric 252. It should be understood that there may be other resources and/or components that are communicatively coupled to PCIe fabric 252 that are not depicted in FIG. 2B.

Each of the host CPUs 251 is communicatively coupled to the PCIe fabric 252 through a root port. Although each CPU 251 is depicted as having a single root port, it should be understood that each CPU 251 may have one or more root ports. Each of the PCIe SSDs 150 are also coupled to the PCIe fabric 252 through one or more host IF ports. Each PCIe SSD 150 of a peer group includes a peer IF port that communicatively couples the PCIe SSD 150 to other PCIe SSD 150 endpoints through a dedicated link within the PCIe fabric 252. In another embodiment, each PCIe SSD 150 of a peer group includes a peer IF port that communicatively couples the PCIe SSD 150 to other PCIe SSD 150 endpoints through a link that is shared with other communications within the PCIe fabric 252. Peer communications between the PCIe SSDs 150 of a peer group may be separate from other communications through the PCIe fabric 252, such as but not limited to between CPUs 251, between CPUs 251 and PCIe SSDs 150, and/or between CPUs 251 and any other resources and/or components (not shown).

FIG. 3A depicts an embodiment of a plurality of network-attached SSDs 100, each having peering capability according to the subject matter disclosed herein, arranged in a network 300 that connects to a single host CPU 301. As depicted in FIG. 3A, the network 300 includes a host CPU 301 and a plurality of network-attached SSDs 100 that are communicatively coupled to a communication network 302, such as, but not limited to, an Ethernet communication network, an InfiniBand communication network, a Fibre Channel communication network, or a Serial Attached SCSI communication network. It should be understood that there may be other resources and/or components that are communicatively coupled to communication network 302 that are not depicted in FIG. 3A.

The host CPU 301 is communicatively coupled to the communication network 302 through a network IF. Each of the SSDs 100 is also coupled to the communication network 302 through one or more network IFs. Each SSD 100 of a peer group includes a peer IF port that communicatively couples the SSD 100 to other SSD 100 endpoints through a dedicated link within the communication network 302. In another embodiment, each SSD 100 of a peer group includes a peer IF port that communicatively couples the SSD 100 to other SSD 100 endpoints through a link that is shared with other communications within the communication network 302. Peer communications between the SSDs 100 of a peer group may be separate from other communications through the communication network 302, such as but not limited to between CPU 301 and SSDs 100, and/or between CPU 300 and any other resources and/or components (not shown).

Figure 3B:
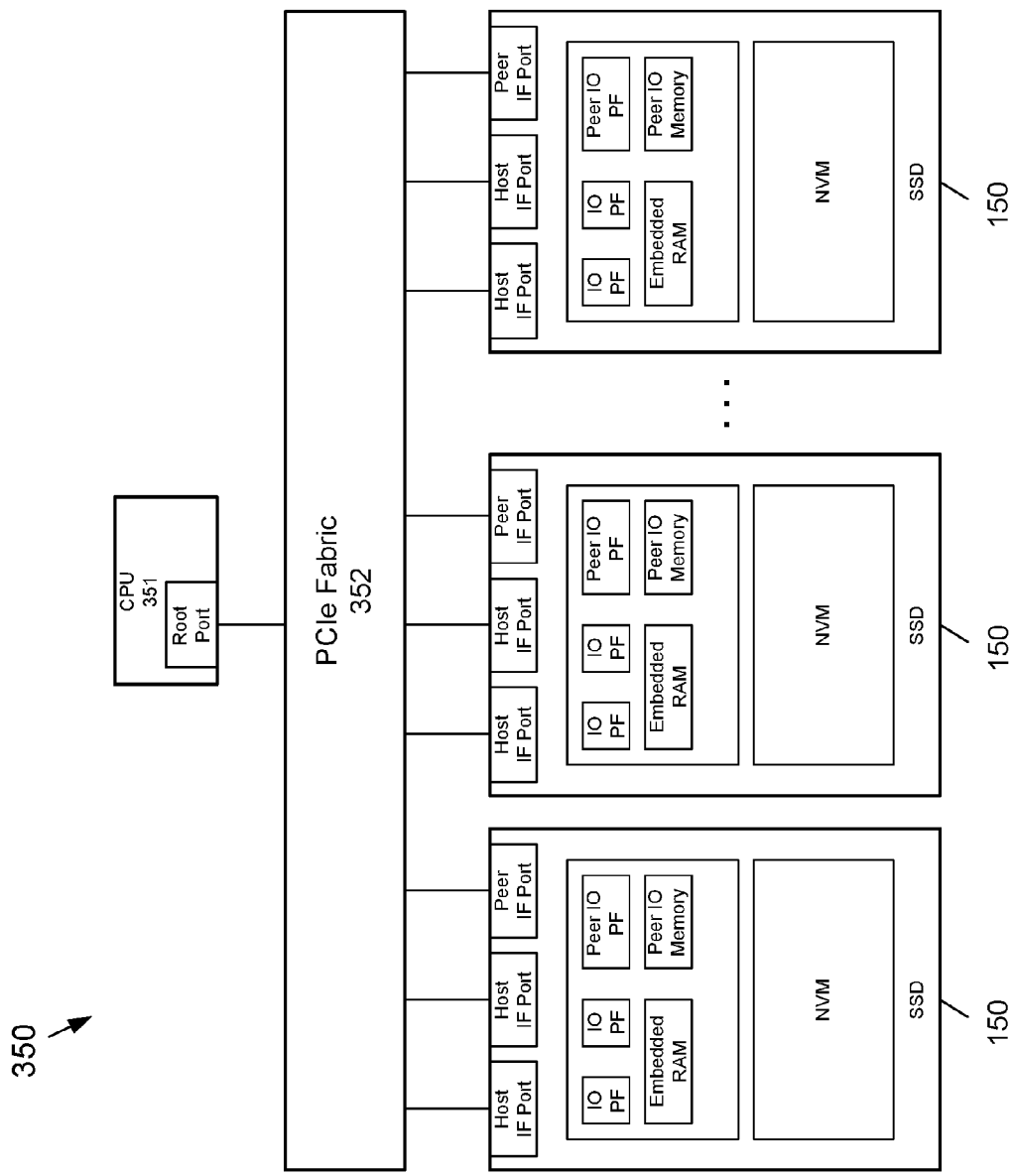
FIG. 3B depicts an embodiment of a plurality of SSDs, each having peering capability according to the subject matter disclosed herein, attached to a PCIe fabric that connects to a single host CPU.

FIG. 3B depicts an embodiment of a plurality of SSDs 150, each having peering capability according to the subject matter disclosed herein, attached to a PCIe fabric 352 that connects to a single host CPU 351. As depicted in FIG. 3B, the network 350 includes a host CPU 351 and a plurality of PCIe SSDs 150 that are communicatively coupled to a PCIe fabric 352. It should be understood that there may be other resources and/or components that are communicatively coupled to PCIe fabric 352 that are not depicted in FIG. 3B.

The host CPU 351 is communicatively coupled to the PCIe fabric 352 through a root port. Although each CPU 351 is depicted as having a single root port, it should be understood that each CPU 351 may have one or more root ports. Each of the PCIe SSDs 150 is also coupled to the PCIe fabric 352 through one or more host IF ports. Each PCIe SSD 150 of a peer group includes a peer IF port that communicatively couples the PCIe SSD 150 to other PCIe SSD 150 endpoints through a dedicated link within the PCIe fabric 352. In another embodiment, each PCIe SSD 150 of a peer group includes a peer IF port that communicatively couples the PCIe SSD 100 to other PCIe SSD 100 endpoints through a link that is shared with other communications within the communication network 352. Peer communications between the PCIe SSDs 150 of a peer group may be separate from other communications through the PCIe fabric 352, such as but not limited to between CPU 351 and PCIe SSDs 150, and/or between CPU 351 and any other resources and/or components (not shown).

Several types of peer groups are possible, such as, but not limited to, a peer group that may have one master endpoint as the primary endpoint, and the other endpoints are secondary endpoints. For this type of peer group, the master endpoint may be the primary target for read and write IOs, and the secondary endpoints may participate in IO completions without any explicit involvement from the host CPU. Another example of a type of peer-group includes a peer group in which all members of the peer group may be treated as equal peers. For this type of peer group, a host CPU sends IOs to all the peers in the group based on a policy, such as round robin, to share the IO load on the endpoints. The peer endpoints, in turn, may transfer the IO completion tasks to their peers in the group without any explicit involvement from the host CPU.

In one embodiment, a logical representation of a peer group of SSDs may include unique identifiers specific to the storage protocol the SSDs support. For example, SCSI-protocol-based devices will support a SCSI Universally Unique ID (UUID). Each SSD may support one or more logical block address (LBA) ranges, and each of the LBA ranges may further be identified by unique identifiers within the scope of an individual SSD or by a global identifier within a cluster of SSDs. SSDs may be part of more than one SSD peer group; for some Peer Groups, an SSD may be assigned to be a primary end point, and for other peer groups, the SSD may be assigned to be a secondary end point. Each SSD peer group may be identified by the same identifier mechanisms as required by the SSD interface.

In another embodiment, a logical representation of a peer group of NVMe SSDs may include system (or subsystem) and namespace identifiers. In one embodiment, PCIe Peer endpoints provide access to the shared namespace in which each PCIe endpoint may be identified by <Bus, Device, Function>. When a PCIe endpoint supports multiple SSD Peer groups, the endpoint may be assigned as primary for some and secondary for others. That is, a PCIe endpoint on a SSD may be part of one or more SSD Peer Groups. For example, for NVMe SSDs, a unique namespace identifier may be used as the identifier for the peer group.

A SSD peer group may be configured for a data-protection scheme such as, but not limited to, replication in which data may be replicated to two or more peers; or erasure coding in which data may be segmented and parity may be computed; and the data and parity segments may be sent to different peers in the group. Other data-protection schemes provided by the subject matter disclosed herein are possible, such as, but not limited to a redundancy syndrome, a non-deterministic error recovery scheme, a RAID x+y data protection scheme, whereby striping (a performance element of RAID) may be utilized with three or more SSDs along with a parity scheme to enhance concurrency, a RAID redundancy scheme that may include Hamming-code parity (RAID 2), mirroring (RAID 1, device-level replication), byte-level striping with parity (RAID 3), block-level striping with distributed or distributed parity (RAID 4 and 5) and/or block-level striping with doubled distributed parity (RAID 6), an erasure coding scheme that may include error correction codes, such as, but not limited to, a Reed-Solomon error correction code or combinations thereof. Additionally, optimizations for parity computations are also possible.

Figure 4A:
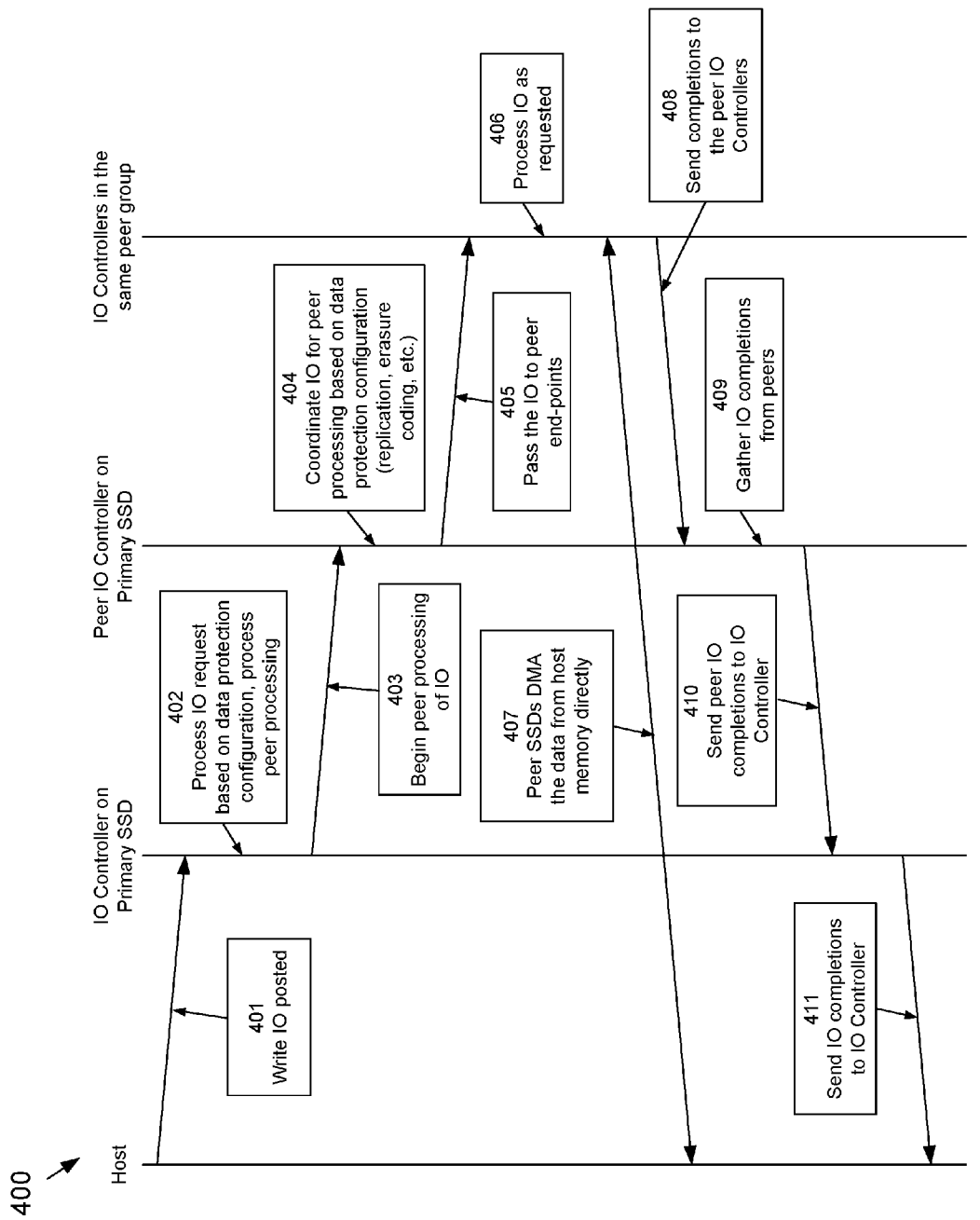
FIG. 4A depicts a flow diagram for a first embodiment of a write IO in a network environment according to the subject matter disclosed herein that provides that data moves only once across a host IO bus.

FIG. 4A depicts a flow diagram 400 for a first embodiment of a write IO in a network environment according to the subject matter disclosed herein that provides that data moves only once across a host IO bus. In FIG. 4A, the IO controllers refer to the IO controllers 104 and 105 in FIG. 1A, and the Peer IO controller refers to the peer IO controller 106 in FIG. 1A. Additionally, the phrase "IO Controllers in the same peer group" in FIG. 4A refers interchangeably to the IO Controller and Peer IO Controller on the non-primary SSDs in the same peer group. At 401, a host initiates a write IO that is targeted at the IO controller of the primary SSD of a peer group. Host memory addresses for the write IO are sent to the primary IO controller, thereby allowing data to move only once across the host IO bus. At 402, the SSD having the primary IO controller receives the IO request, and the controller of the primary SSD processes the IO request based on the data-protection configuration provided by the peer group. At 403, the controller of the primary SSD forwards the IO request to the peer IO controller of the primary SSD. At 404, the peer IO controller of the primary SSD coordinates with the other endpoints of the peer group the peer IO that is associated with the peer processing corresponding to the data-protection configuration. At 405, the peer IO controller forwards the IO request to the secondary endpoints of the peer group through the peer IO controller. At 406, the secondary endpoint SSDs process the write IO as requested, and at 407 the secondary endpoints obtain the data associated with the write IO request directly from the host memory via a direct memory access (DMA) technique, and process the IO request having obtained the data for the write IO. At 408, each secondary SSD sends a write IO completion message to the peer IO controller of the primary SSD. At 409, the peer IO controller of the primary SSD gathers the write IO completion messages from the secondary SSD endpoints. At 410, the peer IO controller of the primary SSD sends a write IO completion message to the IO controller of the primary SSD. At 411, the IO controller of the primary SSD sends a write IO completion message to the host using a standard IO processing technique.

Figure 4B:
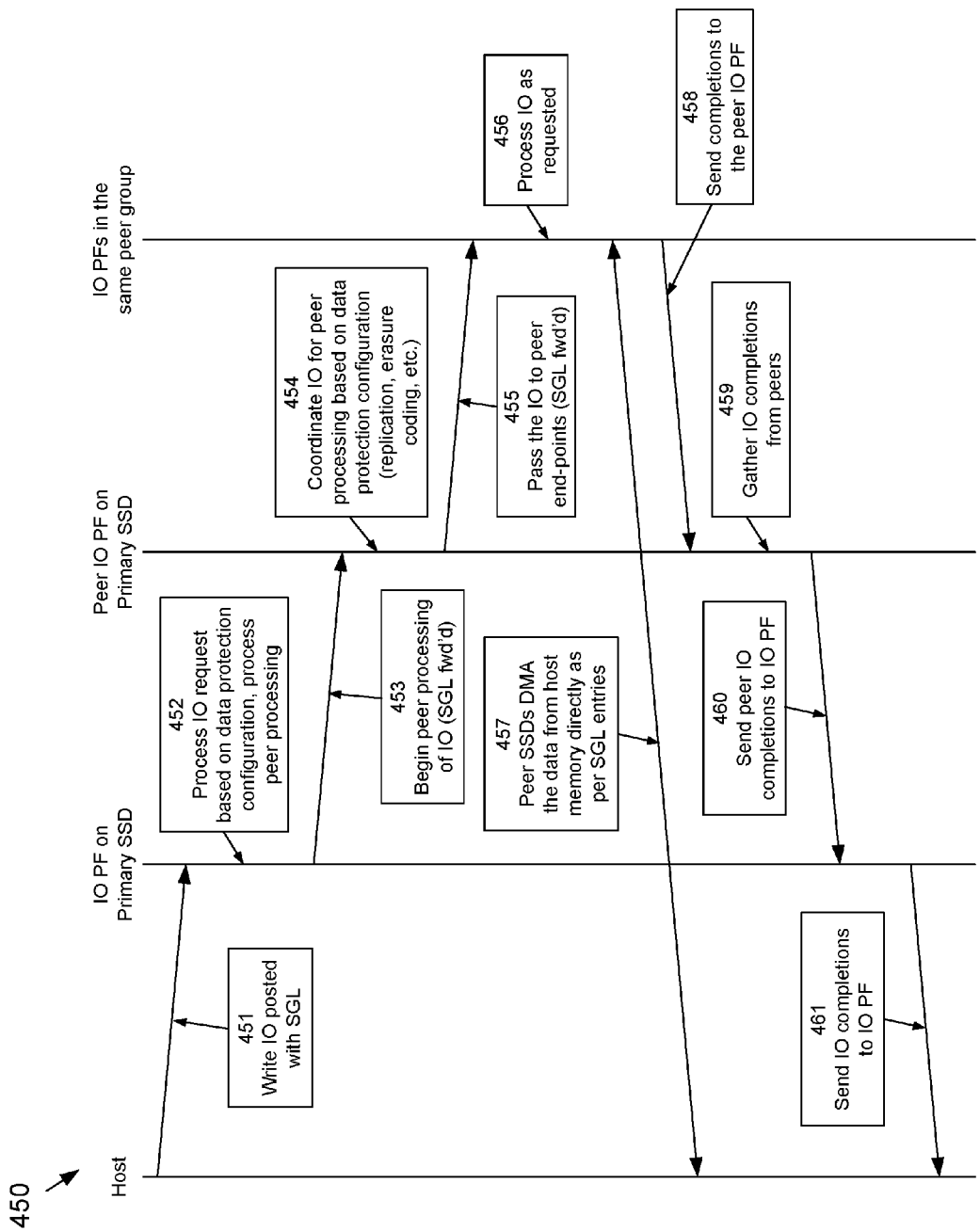
FIG. 4B depicts a flow diagram for a first embodiment of a write IO in a PCIe-fabric environment according to the subject matter disclosed herein that provides that data moves only once across a host IO bus.

FIG. 4B depicts a flow diagram 450 for a first embodiment of a write IO in a PCIe-fabric environment according to the subject matter disclosed herein that provides that data moves only once across a host IO bus. In FIG. 4B, the IOPFs refer to the IO PFs 153 and 154 in FIG. 1B, and the Peer IO PF refers to the Peer IO PF 156 in FIG. 1B. Additionally, the phrase "IO PFs in the same peer group" in FIG. 4B refers interchangeably to the IO PF and Peer IO PF on the non-primary SSDs in the same peer group. At 451, a host initiates a write IO that is targeted at the IO PF of the primary SSD of a peer group. Host memory addresses for the write IO are sent to the primary IO PF with a scatter/gather list (SGL), thereby allowing data to move only once across the host IO bus. At 452, the SSD having the primary IO PF receives the IO request and the associated SGL, and the controller of the primary SSD processes the IO request based on the data-protection configuration provided by the peer group. At 453, the controller of the primary SSD forwards the IO request and the SGL to the peer IO PF of the primary SSD. At 454, the peer IO PF of the primary SSD coordinates with the other endpoints of the peer group the peer IO that is associated with the peer processing corresponding to the data-protection configuration. At 455, the peer IO PF forwards the IO request and SGL to the secondary endpoints of the peer group through the peer IO PF. At 456, the secondary endpoint SSDs process the write IO as requested, and at 457 the secondary endpoints obtain the data associated with the write IO request directly from the host memory via a direct memory access (DMA) technique, and process the IO request having obtained the data for the write IO. At 458, each secondary SSD sends a write IO completion message to the peer IO PF of the primary SSD. At 459, the peer IO PF of the primary SSD gathers the write IO completion messages from the secondary SSD endpoints. At 460, the peer IO PF of the primary SSD sends a write IO completion message to the IO PF of the primary SSD. At 461, the IO PF of the primary SSD sends a write IO completion message to the host using a standard IO processing technique.

Figure 5A:
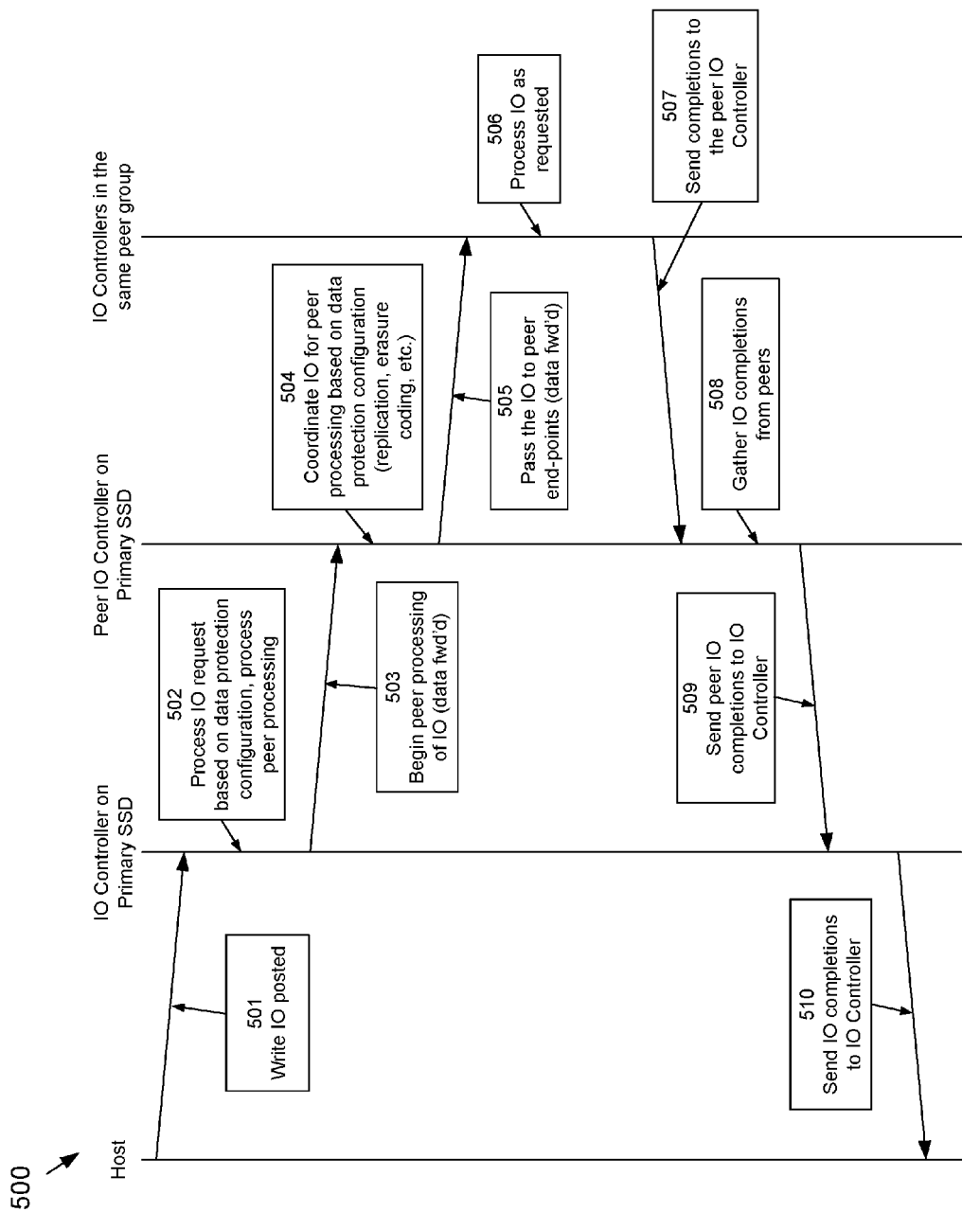
FIG. 5A depicts a flow diagram for a second embodiment of a write IO in a network environment according to the subject matter disclosed herein in which a primary IO PF obtains the data payload from the host.

FIG. 5A depicts a flow diagram 500 for a second embodiment of a write IO in a network environment according to the subject matter disclosed herein in which a primary IO PF obtains the data payload from the host. In FIG. 5A, the IO controllers refer to the IO controllers 104 and 105 in FIG. 1A, and the Peer IO controller refers to the peer IO controller 106 in FIG. 1A. Additionally, the phrase "IO Controllers in the same peer group" in FIG. 4A refers interchangeably to the IO Controller and Peer IO Controller on the non-primary SSDs in the same peer group. At 501, a host initiates a write IO that is targeted at the IO controller of the primary SSD of a peer group. Host memory addresses for the write IO are sent to the primary IO controller. At 552, the SSD having the primary IO controller receives the IO request, and the controller of the primary SSD processes the IO request based on the data-protection configuration provided by the peer group. This includes a data transfer from host memory to the primary SSD. At 503, the controller of the primary SSD forwards the IO request and the data to the peer IO controller of the primary SSD. In one embodiment, the primary SSD obtains the data using a direct memory access (DMA) technique. At 504, the peer IO controller of the primary SSD coordinates with the other endpoints of the peer group the peer IO that is associated with the peer processing corresponding to the data-protection configuration with the other endpoints of the peer group. At 505, the peer IO controller forwards the IO request and the data to the secondary endpoints of the peer group through the peer IO controller. At 506, the secondary endpoint SSDs process the write IO as requested. At 507, each secondary SSD sends a write IO completion message to the peer IO controller of the primary SSD. At 508, the peer IO controller of the primary SSD gathers the write IO completion messages from the secondary SSD endpoints. At 509, the peer IO controller of the primary SSD sends a write IO completion message to the IO controller of the primary SSD. At 510, the IO controller of the primary SSD sends a write IO completion message to the host using a standard IO processing technique.

Figure 5B:
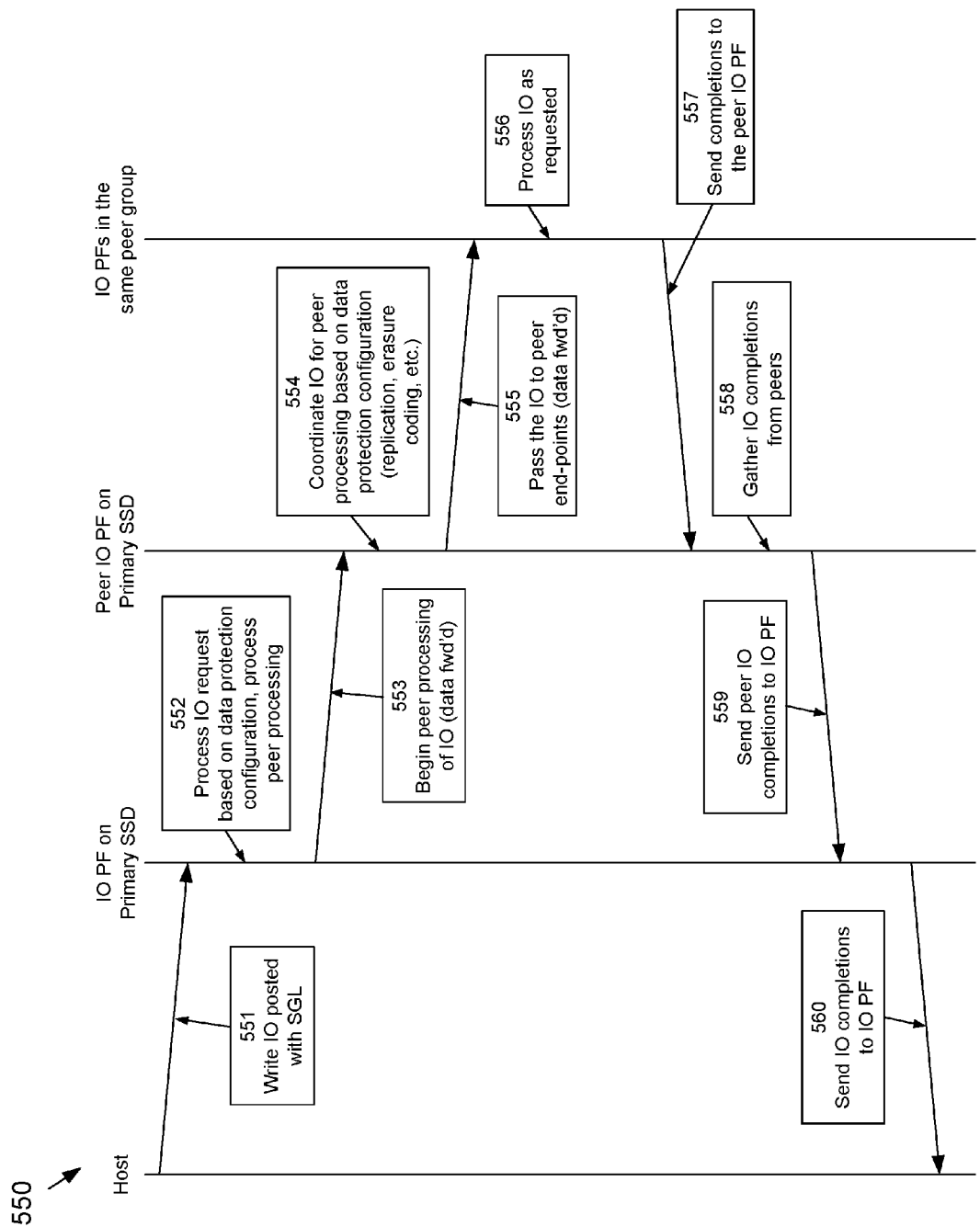
FIG. 5B depicts a flow diagram for a second embodiment of a write IO in a PCIe environment according to the subject matter disclosed herein in which a primary IO PF obtains the data payload from the host.

FIG. 5B depicts a flow diagram 550 for a second embodiment of a write IO in a PCIe-fabric environment according to the subject matter disclosed herein in which a primary IO PF obtains the data payload from the host. In FIG. 5B, the IO PFs refer to the IO PFs 154 and 155 in FIG. 1B, and the Peer IO PFs refer to the peer IO controller 156 in FIG. 1B. Additionally, the phrase "IO PFs in the same peer group" in FIG. 5B refers interchangeably to the IO PF and Peer IO PF on the non-primary SSDs in the same peer group. At 551, a host initiates a write IO that is targeted at the IO PF of the primary SSD of a peer group. Host memory addresses for the write IO are sent to the primary IO PF with a scatter/gather list (SGL). At 552, the SSD having the primary IO PF receives the IO request and the associated SGL, and the controller of the primary SSD processes the IO request based on the data-protection configuration provided by the peer group. This includes a data transfer from host memory to the primary SSD. At 553, the controller of the primary SSD forwards the IO request and the data to the peer IO PF of the primary SSD. In one embodiment, the primary SSD obtains the data using a direct memory access (DMA) technique. At 554, the peer IO PF of the primary SSD coordinates with the other endpoints of the peer group that is associated with the peer processing corresponding to the data-protection configuration with the other endpoints of the peer group. At 555, the peer IO PF forwards the IO request and the data to the secondary endpoints of the peer group through the peer IO PF. At 556, the secondary endpoint SSDs process the write IO as requested. At 557, each secondary SSD sends a write IO completion message to the peer IO PF of the primary SSD. At 558, the peer IO PF of the primary SSD gathers the write IO completion messages from the secondary SSD endpoints. At 559, the peer IO PF of the primary SSD sends a write IO completion message to the IO PF of the primary SSD. At 560, the IO PF of the primary SSD sends a write IO completion message to the host using a standard IO processing technique.

Figure 6A:
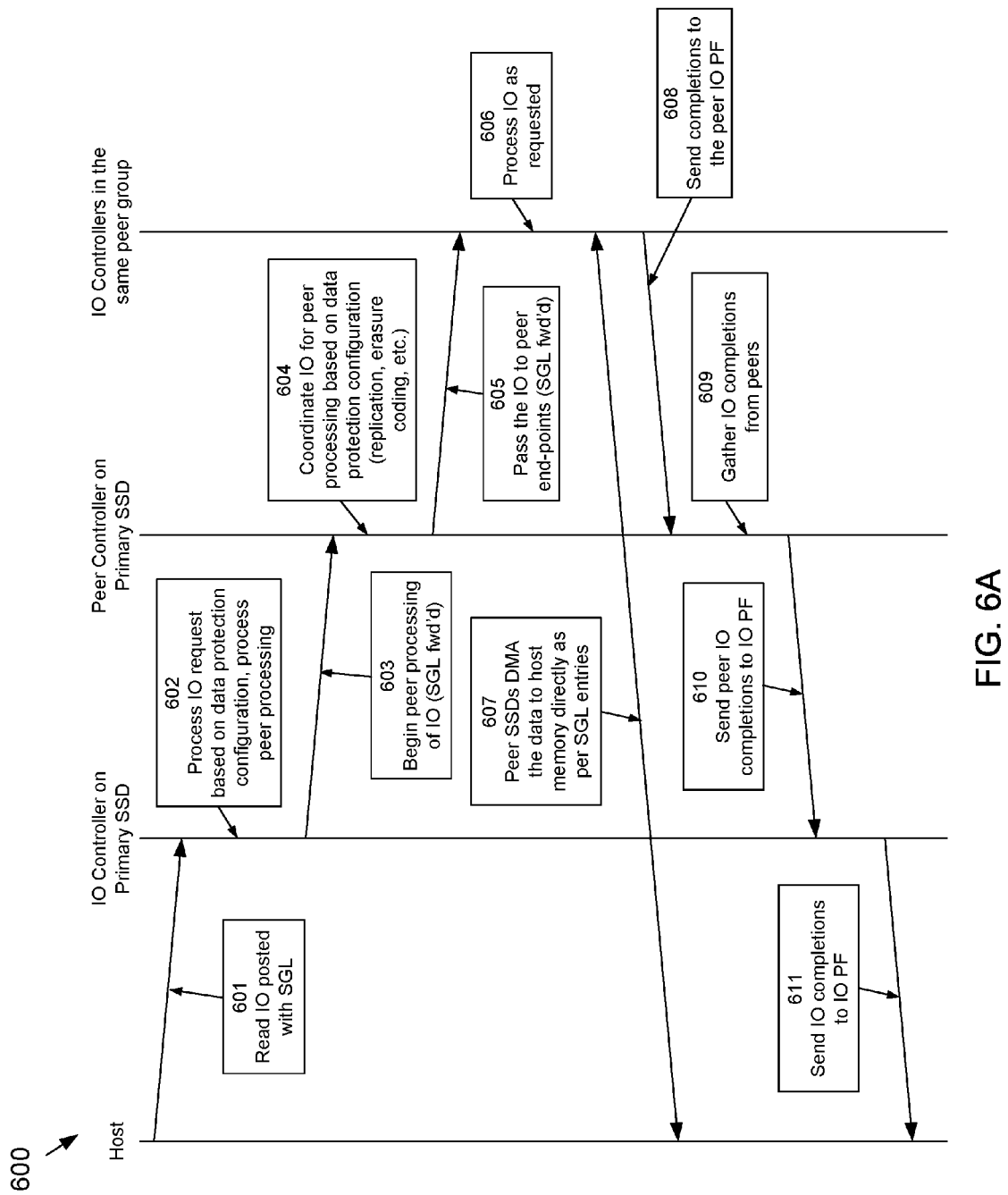
FIG. 6A depicts a flow diagram for an embodiment of a read IO in a network environment according to the subject matter disclosed herein.

FIG. 6A depicts a flow diagram 600 for an embodiment of a read IO in a network environment according to the subject matter disclosed herein. In FIG. 6A, the IO controllers refer to the IO controllers 104 and 105 in FIG. 1A, and the Peer IO controller refers to the peer IO controller 106 in FIG. 1A. Additionally, the phrase "IO Controllers in the same peer group" in FIG. 6A refers interchangeably to the IO Controller and Peer IO Controller on the non-primary SSDs in the same peer group. At 601, a host initiates a read IO that is targeted at the controller of the primary SSD of a peer group. Host memory addresses for the read IO are sent to the primary IO controller, which will allow data to move only once across the host IO bus. At 602, the SSD having the primary IO controller receives the IO request, and the controller of the primary SSD processes the IO request based on the data-protection configuration that is provided by the peer group. At 603, the controller of the primary SSD forwards the IO request to the peer IO controller of the primary SSD. At 604, the peer IO controller of the primary SSD coordinates with the other endpoints of the peer group the peer IO that is associated with the peer processing corresponding to the data-protection configuration. At 605, the peer IO controller forwards the IO request to the secondary endpoints of the peer group through the peer IO controller. At 606, the secondary endpoint SSDs process the read IO as requested, and at 607 the secondary endpoints send the data associated with the read IO request directly to the host memory via a direct memory access (DMA) process. At 608, each secondary SSD sends a read IO completion message to the peer IO controller of the primary SSD. At 609, the peer IO controller of the primary SSD gathers the read IO completion messages from the secondary SSD endpoints. At 610, the peer IO controller of the primary SSD sends a read IO completion message to the IO controller of the primary SSD. At 611, the IO controller of the primary SSD sends a read IO completion message to the host using a standard IO processing technique.

Figure 6B:
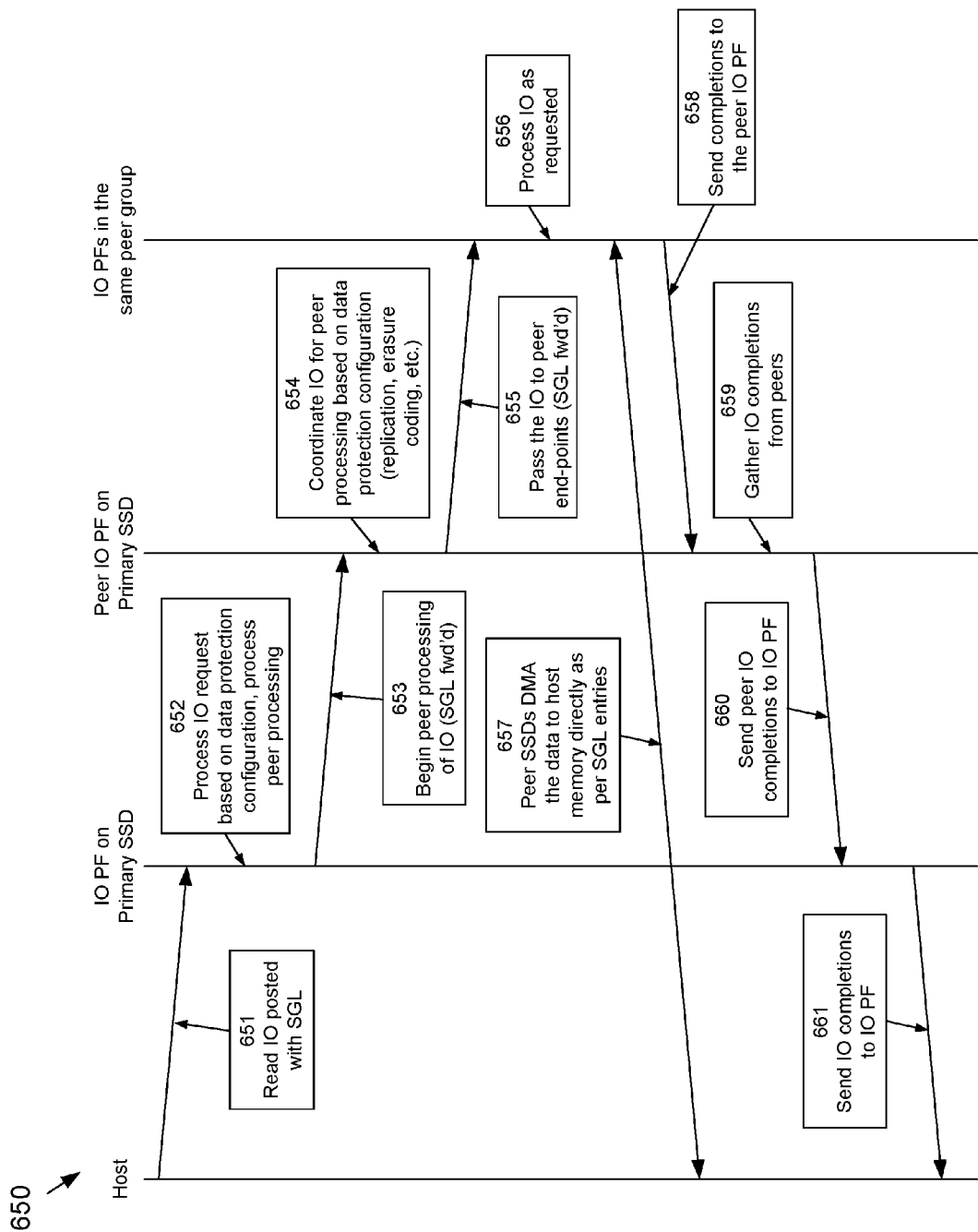
FIG. 6B depicts a flow diagram for an embodiment of a read IO in a PCIe-fabric environment according to the subject matter disclosed herein.

FIG. 6B depicts a flow diagram 650 for an embodiment of a read IO in a PCIe-fabric environment according to the subject matter disclosed herein. In FIG. 6B, the IO PFs refer to the IO PFs 154 and 155 in FIG. 1B, and the Peer IO PFs refer to the peer IO PF 156 in FIG. 1B. Additionally, the phrase, "IO PFs in the same peer group" in FIG. 6B refers interchangeably to the IO PF and Peer IO PF on the non-primary SSDs in the same peer group. At 651, a host initiates a read IO that is targeted at the IO PF of the primary SSD of a peer group. Host memory addresses for the read IO are sent to the primary IO PF with a scatter/gather list (SGL), which will allow data to move only once across the host IO bus. At 652, the SSD having the primary IO PF receives the IO request and the associated SGL, and the controller of the primary SSD processes the IO request based on the data-protection configuration that is provided by the peer group. At 653, the controller of the primary SSD forwards the IO request and the SGL to the peer IO PF of the primary SSD. At 654, the peer IO PF of the primary SSD coordinates with the other endpoints of the peer group the peer IO that is associated with the peer processing corresponding to the data-protection configuration. At 655, the peer IO PF forwards the IO request and SGL to the secondary endpoints of the peer group through the peer IO PF. At 656, the secondary endpoint SSDs process the read IO as requested, and at 657 the secondary endpoints send the data associated with the read IO request directly to the host memory via a direct memory access (DMA) process at the appropriate offsets to the memory locations as specified in the host SGL entries. At 658, each secondary SSD sends a read IO completion message to the peer IO PF of the primary SSD. At 659, the peer IO PF of the primary SSD gathers the read IO completion messages from the secondary SSD endpoints. At 660, the peer IO PF of the primary SSD sends a read IO completion message to the IO PF of the primary SSD. At

661, the IO PF of the primary SSD sends a read IO completion message to the host using a standard IO processing technique.

Figure 7:
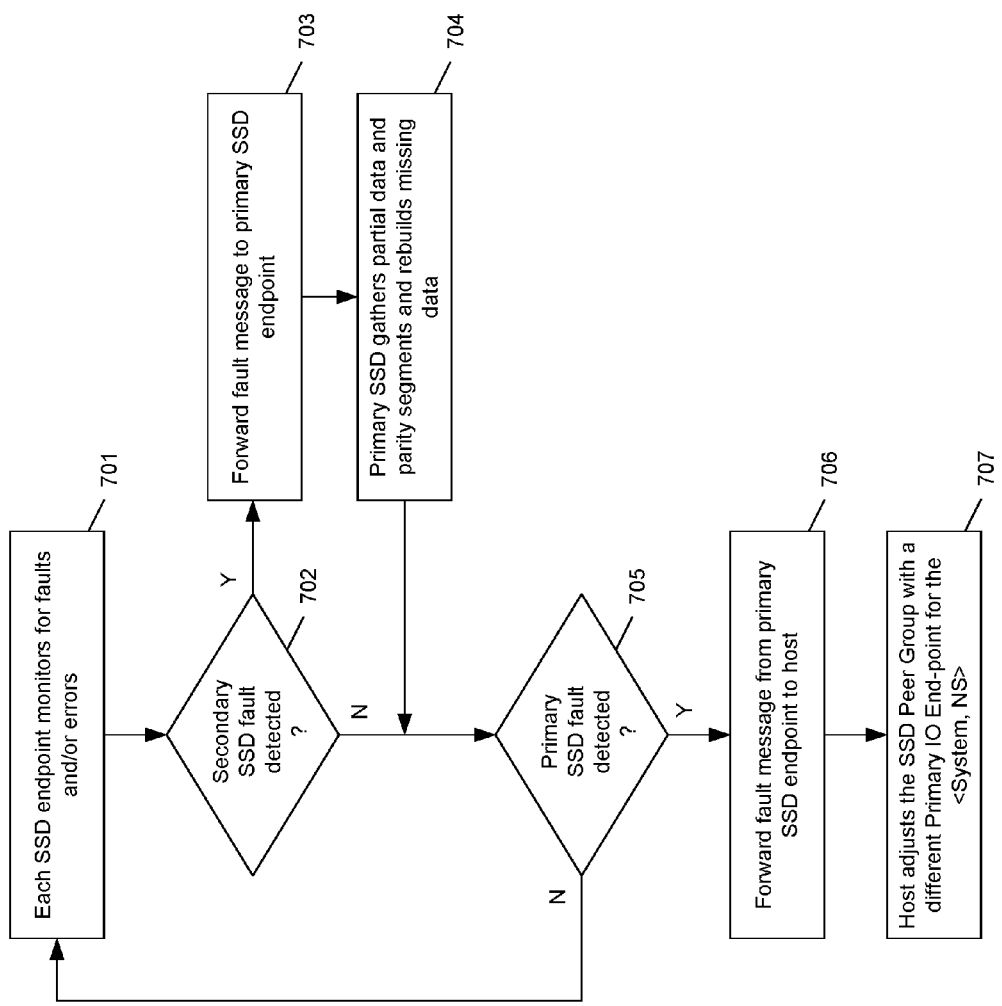
FIG. 7 depicts a flow diagram of an embodiment of a fault-handling process at a system level according to the subject matter disclosed herein.

The subject matter disclosed herein also provides peering-capable SSDs that also have a capability for handling failures or errors within a peer group. FIG. 7 depicts a flow diagram 700 of an embodiment of a fault-handling process at a system level according to the subject matter disclosed herein. It should be understood that the flow diagram 700 depicts a fault-handling process for a peer group in which a primary SSD has been designated. Fault handing for other peer configurations would be similar. At 701, each endpoint SSD in a peer group monitors itself to determine whether any faults or errors have occurred internally. At 702, it is determined whether a fault has occurred at a secondary endpoint SSD. In one embodiment, the determination takes place at each SSD endpoint. If, at 702, no fault has been detected at a secondary endpoint, flow continues to 705, otherwise flow continues to 703 where a fault message is forwarded from the secondary endpoint detecting the fault to the primary SSD. The fault message may include information, such as but not limited to, a fault code or an error code, and a range of data and/or parity information experiencing the fault. If the SSD endpoint detecting the fault is the primary SSD, flow would also continue to 704. At 704, the controller of the primary SSD endpoint gathers partial data from the secondary SSD endpoint having the fault and/or from the other SSDs, and rebuilds the missing data, and stores the rebuilt data in reserved places on the remaining PCIe endpoints in the peer group. If the data-protection configuration includes a hot-spare in the storage system, the data may be replicated or reconstructed to a hot-spare SSD. Changes to an IO PF within an SSD peer group are not expected to change any IO processing at a host system; however, the change information may be used system management purposes.

Flow continues to 705, where it is determined whether the primary SSD endpoint has detected an internal fault based on, but not limited to, parity computations relating to the coordinated data-protection configuration of the peer group. If, at 705, no internal fault has been detected at the primary SSD endpoint, flow returns to 701. If, at 705, an internal fault has been detected at the primary SSD endpoint based on, but not limited to, parity computations relating to the coordinated data-protection configuration of the peer group, flow continues to 706 the primary endpoint SSD forwards a fault message to the host. In one embodiment, the primary SSD endpoint may use an Asynchronous (Async) Notification to alert the host about the peer group errors and/or changes within the peer group. At 707, the host may reconfigure the SSD peer group in view of the detected fault and may adjust the SSD peer group to have a different primary SSD endpoint for the system <System, NS> and/or a different data-protection configuration. In another embodiment, the peer SSDs may elect a new primary SSD endpoint and communicate information relating to the new SSD endpoint to the host. In one embodiment, the host does not need to change its IO processing other than retargeting IOs to the new primary IO endpoint for an affected SSD peer group.

Figure 8:
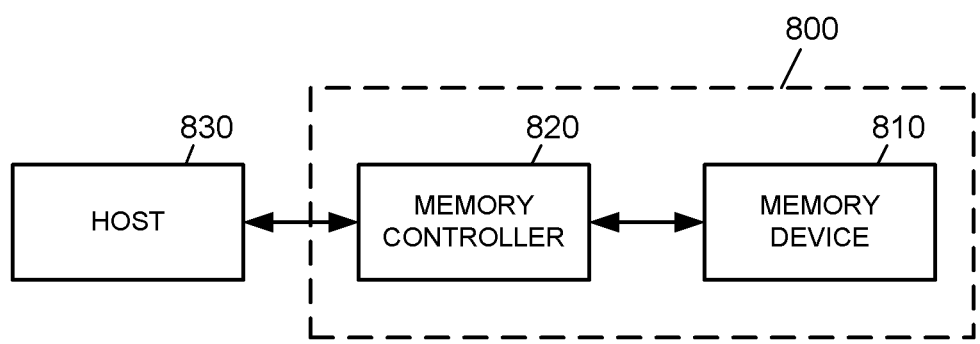
FIG. 8 depicts a memory system that may include a storage system having features and capabilities that may be embedded in one or more SSDs to form a peer group of SSD endpoints according to the subject matter disclosed herein.

FIG. 8 depicts a memory system 800 that may include a storage system having features and capabilities that may be embedded in one or more SSDs to form a peer group of SSD endpoints according to the subject matter disclosed herein. The memory system 800 may include a memory device 810 for storing large amounts of data and a memory controller 820. The memory controller 820 controls the memory device 810 to read data stored in the memory device 810 or to write data into the memory device 810 in response to a read/write request of a host 830. The memory controller 820 may include an address-mapping table for mapping an address provided from the host 830 (e.g., a mobile device or a computer system) into a physical address of the memory device 810. The memory device 810 may include a storage system having features and capabilities that may be embedded in one or more SSDs to form a peer group of SSD endpoints according to the subject matter disclosed herein.

As will be recognized by those skilled in the art, the innovative concepts described herein can be modified and varied over a wide range of applications. Accordingly, the scope of claimed subject matter should not be limited to any of the specific exemplary teachings discussed above, but is instead defined by the following claims.

What is claimed is:

1. A storage system, comprising:
a plurality of solid-state drives (SSDs) comprising at least one peer group of SSDs, a first SSD of the at least one peer group of SSD comprising a primary SSD of the at least one peer group of SSDs, the SSDs of the at least one peer group of SSDs further comprising:
a host interface port to be communicatively coupled to at least one host computing device, the host interface port to receive input/output (I/O) communications from the at least one host computing device;
a peer-interface port to be communicatively coupled to the peer-interface port of at least one second SSD in the at least one peer group of SSDs; and
a controller coupled to the host interface port and the peer-interface port, the controller of the primary SSD to be responsive to I/O communications received from the at least one host computing device to provide data-protection computations relating to a coordinated data-protection configuration provided by the at least one peer group of SSDs and to pass coordinated data-protection configuration information to the controllers of the at least one second SSDs of the at least one peer group of SSDs through the peer-interface port.

2. The storage system according to claim 1, wherein the at least one second SSD comprises a secondary SSD of the at least one peer group of SSDs.

3. The storage system according to claim 1, wherein the host interface ports of the SSDs of the at least one peer group of SSDs are to be coupled to the at least one host computing device through a Peripheral Component Interface Express (PCIe) communication network, an Ethernet communication network, an InfiniBand communication network, a Fibre Channel communication network, or a Serial Attached SCSI communication network.

4. The storage system according to claim 1, wherein the peer-interface port of the first SSD is to be coupled to the peer-interface port of at least one second SSD through a Peripheral Component Interface Express (PCIe) communication network, an Ethernet communication network, an InfiniBand communication network, a Fibre Channel communication network, or a Serial Attached SCSI communication network.

5. The storage system according to claim 1, wherein the coordinated data-protection configuration comprises a replication configuration, an erasure-coding configuration, a replication syndrome, a non-deterministic error recovery scheme, a RAID x+y data protection scheme, striping, a RAID redundancy scheme that includes Hamming-code parity, mirroring, byte-level striping with parity, block-level striping with distributed or distributed parity and/or block-level striping with doubled distributed parity, an erasure coding scheme that includes an error correction code, or a combination thereof.

6. The storage system according to claim 1, wherein at least one SSD of the at least one peer group of SSDs is identified by an identifier corresponding to a communication protocol of the host interface port.

7. The storage system according to claim 1, wherein at least one SSD of the at least one peer group of SSDs receives information through the host interface port identifying the SSD as a primary SSD or as a secondary SSD.

8. The storage system according to claim 1, wherein the I/O communications comprises a write I/O communication received from the at least one host computing device,
wherein at least one SSD of the at least one peer group of SSDs to receive data through the host interface port of the SSD directly from a memory of the at least one computing device, the received data being allocated to the SSD based on the coordinated data-protection configuration,
wherein the at least one SSD of the at least one peer group of SSDs to receive the data allocated based on the coordinated data-protection configuration further sends a peer write transaction complete communication to the primary SSD of the at least one peer group of SSDs through the peer-interface port upon completion of a write operation of the data allocated to the at least one SSD, and
wherein the controller of the primary SSD of the at least one peer group of SSDs further sends a write transaction complete communication to the at least one host computing device upon receiving a peer write transaction complete from at least one other SSD of the peer group of SSDs.

9. The storage system according to claim 1, wherein the I/O communications comprises a write I/O communication received from the at least one host computing device,
wherein the primary SSD of the at least one peer group of SSDs further receives data from the at least one host computing device through the host interface port, the at least one second SSD of the peer group of SSDs receiving the data from the controller of the primary SSD through the peer-interface port of the at least one SSD based on the coordinated data-protection configuration,
wherein the at least one second SSD of the at least one peer group of SSDs to receive the data allocated based on the coordinated data-protection configuration further sends a peer write transaction complete communication to the primary SSD of the at least one peer group of SSDs through the peer-interface port upon completion of a write operation of the data allocated to the at least one second SSD, and
wherein the primary SSD of the at least one peer group of SSDs further sends a write transaction complete communication to the at least one host computing device upon receiving a peer write transaction complete from the at least one second SSD of the at least one peer group of SSDs.

10. The storage system according to claim 1, wherein the I/O communications comprises a read I/O communication received from the at least one host computing device,
wherein at least one SSD of the at least one peer group of SSDs further sends data through the host interface port of the at least one SSD directly to the at least one host computing device, the data to be sent being allocated to the at least one SSD based on the coordinated data-protection configuration,
wherein at least one SSD of the at least one peer group of SSDs further sends a peer read transaction complete communication to the primary SSD of the at least one peer group of SSDs through the peer-interface port upon completion of a read operation by the SSD, and
wherein the primary SSD of the at least one peer group of SSDs further sends a read transaction complete communication to the at least one host computing device upon receiving a peer read transaction complete from the other SSDs of the at least one peer group of SSDs.

11. A solid-state drive (SSD), comprising:
a host interface port capable of being communicatively coupled to at least one host computing device, the host interface port to receive input/output (I/O) communications from the at least one host computing device;
a peer-interface port capable of being communicatively coupled to a peer-interface port of other SSDs of a peer group of SSDs; and
a controller coupled to the interface port and the peer-interface port, the controller to be responsive to I/O communications received from the at least one host computing device to provide data-protection computations relating to a coordinated data-protection configuration provided by the peer group and to pass coordinated data-protection configuration information to the controllers of the other SSDs of the peer group through the peer-interface port.

12. The SSD according to claim 11, wherein the host interface port of the SSD is capable of being coupled to the at least one host computing system through a Peripheral Component Interface Express (PCIe) communication network, an Ethernet communication network, an InfiniBand communication network, a Fibre Channel communication network, or a Serial Attached SCSI communication network.

13. The SSD according to claim 11, wherein the peer-interface port of the SSD is capable of being coupled to a peer-interface port of another SSD through a Peripheral Component Interface Express (PCIe) communication network, an Ethernet communication network, an InfiniBand communication network, a Fibre Channel communication network, or a Serial Attached SCSI communication network.

14. The SSD according to claim 11, wherein the data-protection configuration comprises a replication configuration, an erasure-coding configuration, a replication syndrome, a non-deterministic error recovery scheme, a RAID x+y data protection scheme, striping, a RAID redundancy scheme that includes Hamming-code parity, mirroring, byte-level striping with parity, block-level striping with distributed or distributed parity and/or block-level striping with doubled distributed parity, an erasure coding scheme that includes an error correction code, or a combination thereof.

15. The SSD according to claim 11, wherein the SSD is identified in a peer group of SSDs by an identifier corresponding to a communication protocol of the host interface port.

16. The SSD according to claim 11, wherein the SSD receives information through the host interface port identifying the SSD as a primary SSD or as a secondary SSD.

17. The SSD according to claim 11, wherein the I/O communications comprises a write I/O communication received from the at least one host computing device, and the SSD is a primary SSD of the peer group,
wherein the SSD receives data through the host interface port of the SSD directly from a memory of the at least one host computing device, the received data to be allocated to the SSD based on the coordinated data-protection configuration, wherein the SSD further receives a peer write transaction complete communication from other SSD of the peer group through the peer-interface port upon, and wherein the SSD further sends a write transaction complete communication to the at least one host computing device upon receiving a peer write transaction complete from the other SSDs of the peer group.

18. The SSD according to claim 11, wherein the I/O communications comprises a write I/O communication received from the at least one host computing device, and the SSD is a primary SSD of the peer group, wherein the SSD receives data from the at least one host computing system through the host interface port of the SSD, the received data being based on the coordinated data-protection configuration, and wherein the SSD further sends a write transaction complete communication to the at least one host computing device upon receiving a peer write transaction complete from the other SSDs of the peer group.

19. The SSD according to claim 11, wherein the I/O communications comprises a read I/O communication received from the at least one host computing device, and the SSD is a primary SSD of the peer group, wherein the SSD sends data through the host interface port of the SSD directly to a memory of the at least one host computing device, the data being allocated to the SSD based on the coordinated data-protection configuration, and wherein the SSD further sends a read transaction complete communication to the at least one host computing device upon receiving a peer read transaction complete from other SSDs of the peer group.

20. The SSD according to claim 11, wherein the group of SSDs is configured to include a primary SSD and at least one secondary SSD, or is configured to include a plurality of SSDs that are treated as equal peers.

21. A storage system, comprising:
a plurality of solid-state drives (SSDs) comprising at least one peer group of SSDs, the SSDs of the at least one peer group of SSDs comprising:
a host interface port to be communicatively coupled to at least one host computing device, the host interface port to receive input/output (I/O) communications from the at least one host computing device;
a peer-interface port to be communicatively coupled to the peer-interface port of other SSDs in the at least one peer group of SSDs; and
a controller coupled to the host interface port and the peer-interface port, the controller to be responsive to I/O communications received from the at least one host computing device to provide data-protection computations relating to a coordinated data-protection configuration provided by the at least one peer group of SSDs and to pass coordinated data-protection configuration information to other SSDs of the at least one peer group of SSDs through the peer-interface port.

22. The storage system according to claim 21, wherein one SSD of the at least one peer group of SSDs comprise a primary SSD of the at least one peer group of SSDs and other SSDs of the at least one peer group of SSDs are secondary SSDs of the at least one peer group of SSDs.

23. The storage system according to claim 21, wherein the host interface port of at least one SSD is communicatively coupled to the at least one host computing device through a Peripheral Component Interface Express (PCIe) communication network, an Ethernet communication network, an InfiniBand communication network, a Fibre Channel communication network, or a Serial Attached SCSI communication network.

24. The storage system according to claim 21, wherein the peer-interface port of at least one SSD is to be coupled to at least one other peer endpoint of the at least one peer group of SSDs through a Peripheral Component Interface Express (PCIe) communication network, an Ethernet communication network, an InfiniBand communication network, a Fibre Channel communication network, or a Serial Attached SCSI communication network.

25. The storage system according to claim 21, wherein the coordinated data-protection configuration comprises a replication configuration, an erasure-coding configuration, a replication syndrome, a non-deterministic error recovery scheme, a RAID x+y data protection scheme, striping, a RAID redundancy scheme that includes Hamming-code parity, mirroring, byte-level striping with parity, block-level striping with distributed or distributed parity and/or block-level striping with doubled distributed parity, an erasure coding scheme that includes an error correction code, or a combination thereof.

26. The storage system according to claim 21, wherein at least one SSD of the at least one peer group of SSDs is identified by an identifier corresponding to a communication protocol of the host interface port.

27. The storage system according to claim 21, wherein at least one SSD of the at least one peer group of SSDs receives information through the host interface port of the SSD identifying the SSD as a primary SSD or as a secondary SSD.

28. The storage system according to claim 21, wherein the at least one peer group of SSDs is configured to include a primary SSD and at least one secondary SSD, or is configured to include a plurality of SSDs that are treated as equal peers.

* * * * *